(12) United States Patent
Campbell

(10) Patent No.: US 9,577,424 B2
(45) Date of Patent: Feb. 21, 2017

(54) PARALLEL MOTOR DRIVE DISABLE VERIFICATION SYSTEM AND METHOD

(75) Inventor: Alan J. Campbell, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 1397 days.

(21) Appl. No.: 12/837,628

(22) Filed: Jul. 16, 2010

(65) Prior Publication Data

US 2012/0013284 A1    Jan. 19, 2012

(51) Int. Cl.
  *H02P 5/00* (2016.01)
  *H02H 7/08* (2006.01)
  *G01R 31/42* (2006.01)
  *H02P 29/02* (2016.01)

(52) U.S. Cl.
  CPC ............. *H02H 7/08* (2013.01); *G01R 31/42* (2013.01); *H02P 29/02* (2013.01)

(58) Field of Classification Search
  CPC ..... H02P 5/68; H02P 5/69; B60K 6/46; F04D 25/166
  USPC ..... 318/112, 49, 51, 567; 363/65, 67, 69, 71
  See application file for complete search history.

(56) References Cited

U.S. PATENT DOCUMENTS

| | | | | |
|---|---|---|---|---|
| 5,365,153 A | * | 11/1994 | Fujita et al. | 318/34 |
| 5,646,458 A | * | 7/1997 | Bowyer et al. | 307/67 |
| 6,989,650 B2 | * | 1/2006 | Williams | 318/811 |
| 7,277,304 B2 | * | 10/2007 | Stancu et al. | 363/71 |
| 7,301,296 B1 | * | 11/2007 | Discenzo | 318/400.04 |
| 7,561,448 B2 | * | 7/2009 | Katayama et al. | 363/40 |
| 7,906,933 B2 | * | 3/2011 | Tan et al. | 318/801 |
| 7,994,798 B2 | * | 8/2011 | Williams et al. | 324/537 |

* cited by examiner

*Primary Examiner* — Rina Duda
(74) *Attorney, Agent, or Firm* — Fletcher Yoder P.C.

(57) ABSTRACT

Systems and methods are provided for performing diagnostic testing for multiple motor drives operating in parallel. In one embodiment, the diagnostic testing may involve determining which of the multiple motor drives are in operation and communicating the active configuration of motor drives to testing circuitry. The testing circuitry generates an enable input signal transmitted to the transistor gates in each of the active motor drives. The testing circuitry also generates a power supply input signal transmitted to a DC to DC converter in each of the active motor drives. The responses to the enable input signal and the power supply input signal are measured to determine safety compliance.

26 Claims, 5 Drawing Sheets

PARALLEL MOTOR DRIVE DISABLE VERIFICATION SYSTEM AND METHOD

BACKGROUND

The invention relates generally to the field of electrical power converters and inverters. More particularly, the invention relates to techniques for verifying that disable circuitry of parallel motor drives are functioning properly.

Large number of topographies and types of power conversion circuits are known and are in use. Many of these circuits rely upon inverter topologies for converting direct current (DC) power to control frequency alternating current (AC) power. In many topologies a rectifier or other converter is provided to receive incoming AC power, typically from the grid, and to convert the AC power to DC power that is applied to a DC bus used to feed the inverter circuitry. Such topologies are used in a variety of applications, such as for controlling the speed and operating characteristics of motors.

Motor drives utilizing inverter topologies often employ a single converter and single inverter coupled to one another by a single DC bus. Conventional inverters are formed by solid state switches provided in pairs and alternately switched between conducting and non-conducting states to provided desired output waveforms, typically of controlled frequency. Such topologies are adequate for many smaller applications, and may vary in size depending upon the power rating, frame size, voltage, and other specifications of the driven motor. However, for larger motors the components of such drives become proportionally large and expensive. It becomes attractive, then, to use alternative topologies in which multiple inverters are provided in parallel, with their outputs being joined to provide a common AC output to a load.

Such parallel inverter applications pose unique difficulties. For example, in certain circumstances it may be necessary to disable the motor drives. However, in some cases, decoupling one motor drive may affect the power delivered to parallel motor drives or to other motor drive circuitry that may be useful even though power is not being delivered to the load. Therefore, it may be useful in some circumstances to disable certain circuitry within the motor drive that will prevent the motor drive from outputting power to the load while maintaining the operability of certain control functions or other parallel motor drives in the system. In this way, useful functions of the power module may still be used while the output power to the load is disabled. Additionally, other motor drives operating in parallel may not be affected by the decoupling of one motor drive in the system. In these and other situations, it may be useful and even advisable to disable (e.g., shut down) one or more paralleled motor drives when certain unwanted conditions arise.

Moreover, in many cases it would be very useful to provide techniques to verify that the shutdown circuitry will operate properly when engaged. For example, a verification circuit may be used to periodically test the shutdown circuitry. The shutdown test may, however, tend to stress the power module circuitry or the load device, possibly leading to device failure. For pulsed motor drives, for example, rapid interruption and re-initiation of a pulse train powering the load can cause high potential differences within and between phase conductors that can lead to degradation of insulating systems, and eventually to failure of the motor or other system component. Also, interruption of actual drive power to a motor during such verification tests is generally undesirable. It may be advantageous, therefore, to provide a less disruptive system and method of testing a shutdown circuitry which may be used in a parallel motor drive system. To date, however, reliable disable-verification techniques for parallel motor drives that do not perturb the normal operation of the drive circuitry have yet to be developed or proposed.

BRIEF DESCRIPTION

The present invention relates generally to systems and methods of verifying the proper operation of a shutdown circuitry. Embodiments include systems and methods of reducing or eliminating the electrical stress on motor windings due to a shutdown test pulse from the motor control circuitry that verifies the operability of a shutdown circuitry used in a parallel motor drive configuration. In the embodiments described below, multiple motor drives operating in parallel may be verified for proper shutdown operation by employing fiber optic components to interface the motor control circuitry and each of the parallel motor drives.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Typically, pulse width modulation is used to drive an inverter module for delivering power to a motor. The inverter module includes a set of solid state switches, such as insulated gate bipolar transistors (IGBTs) that are rapidly switched on and off to create an approximately sinusoidal waveform at the output of the inverter. Because the motor is inductive, currents continue to flow even when the power module is disabled by the shutdown test pulse, which can result in the pulsed voltage output changing polarity instantaneously. At the end of the shutdown test pulse, when the power module is enabled, the voltage output can reverse polarity again. Voltage polarity reversals in quick succession could result in a high voltage spike on the motor that may tend to damage motor winding insulation. To avoid this, present embodiments use a shutdown test pulse that is short enough in duration, that the output power from the inverter circuitry remains substantially unaffected.

Furthermore, the present embodiments may be adapted for motor drive systems having multiple inverter modules operating in parallel. For example, fiber optic components may be utilized to interface the control circuitry with the inverter circuitry of each of the multiple inverter modules. Testing circuitry may be implemented on either side of the fiber optic interface in the control circuitry and in the inverter circuitry. As each of the inverters may include testing circuitry in communication with the control circuitry, such shutdown testing may be performed in parallel.

Figure 1:
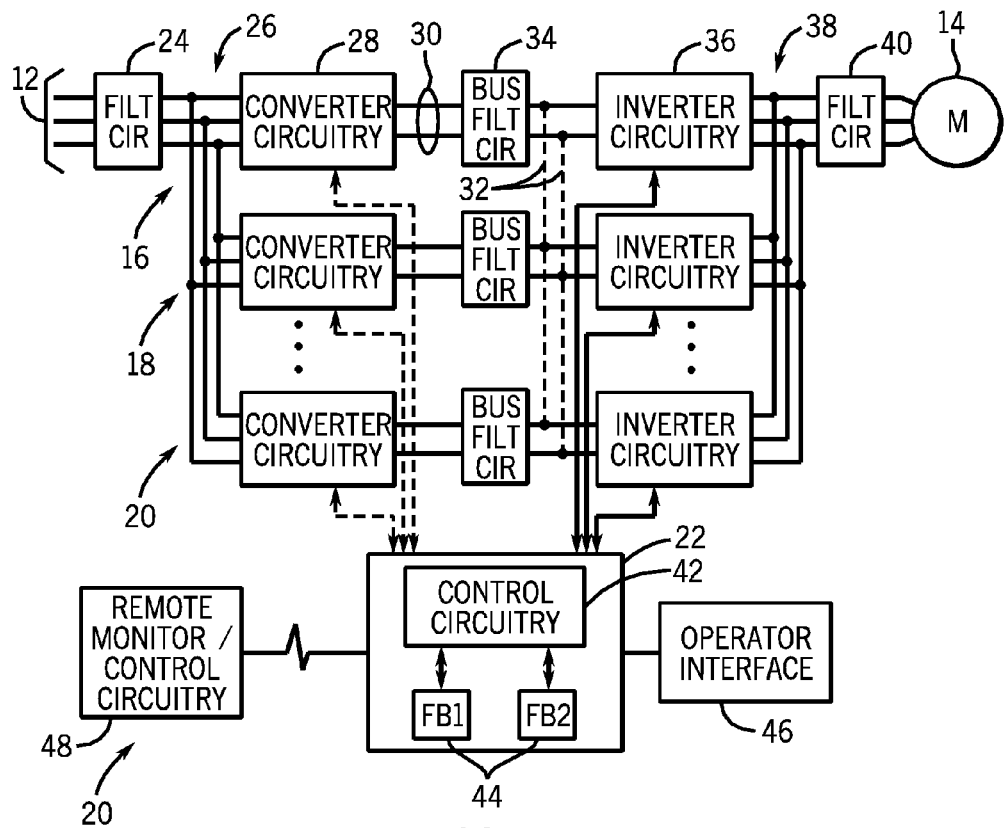
FIG. 1 is a diagrammatical representation of a motor drive system, in accordance with aspects of the present techniques.

FIG. 1 represents a drive system 10 in accordance with aspects of the present disclosure. The drive system is configured to be coupled to a source of AC power, such as the power grid, as indicated by reference numeral 12, and to deliver conditioned power to a motor 14 or any other suitable load. The system 10 comprises a plurality of individual drives coupled to one another in parallel to provide power to the load. In the example illustrated in FIG. 1, for example, a first drive 16 is illustrated as coupled to a second drive 18 and a further drive 20 which may be the third, fourth, fifth or any suitable terminally numbered drive. A presently contemplated embodiment may accommodate up to 5 parallel drives, although fewer or more may be configured in the same way. It should be noted that certain aspects of the techniques described herein may be used with a single drive. However, other aspects are particularly well-suited for multiple parallel drives.

A controller 22 is coupled to the circuitry of each drive and is configured to control operation of the circuitry as described more fully below. In a presently contemplated embodiment, the controller may be housed in one of the drives or in a separate enclosure. Appropriate cabling (e.g., fiber optic cabling) is provided to communicate control and feedback signals between the controller and the circuitry of the individual drives. The controller will coordinate operation of the drives to ensure that the provision of power is shared and that operation of the drives is synchronized sufficiently to provide the desired power output to the motor. In the embodiment illustrated in FIG. 1, power filtration circuitry 24 may be provided upstream of the motor drives. Such circuitry may be provided upstream of a line-side bus 26 or similar circuitry may be provided downstream of the bus in each of the drives. Such circuitry may include inductors, capacitors, circuit breakers, fuses, and so forth that are generally conventional in design and application.

The power bus 26 distributes three phases of AC power between the individual drives. Downstream of this bus, each drive includes converter circuitry 28 that converts the three phases of AC power to DC power that is applied to a DC bus 30. The converter circuitry 28 may be passive or active. That is, in a presently contemplated embodiment non-switched circuitry alone is used to define a full wave rectifier that converts the incoming AC power to DC power that is applied to the bus. In other embodiments the converter circuitry 28 may be active, including controlled power electronic switches that are switched between conducting and non-conducting states to control the characteristics of the DC power applied to the bus.

Continuing with the components of each drive, bus filtration circuitry 34 may be provided that conditions the DC power conveyed along the DC busses 30. Such filtration circuitry may include, for example, capacitors, inductors (e.g., chokes), braking resistors, and so forth. In some embodiments common devices may be provided on the DC busses, which may be coupled to one another by links illustrated by reference numeral 32.

Each drive further includes inverter circuitry 36. As will be appreciated by those skilled in the art, such circuitry will typically include sets of power electronic switches, such as IGBTs and diodes arranged to allow for converting the DC power from the bus to controlled frequency AC output waveforms. The inverters thus create three phases of controlled frequency output, with each phase being shorted or combined along an output bus 38. The combined power may be applied to output filtration circuitry 40, which may include magnetic components that couple the output power between the phases. Such circuitry may also be provided along the load-side bus 38.

The controller 22 will typically include control circuitry 42 that is configured to implement various control regimes by properly signaling the inverter circuitry (and, where appropriate, the converter circuitry) to control the power electronic switches within these circuits. The control circuitry 42 may, for example, include any suitable processor, such as a microprocessor, field-programmable gate array (FPGA), memory circuitry, supporting power supplies, and so forth. In motor drive applications, the control circuitry may be configured to implement various desired control regimes, such as for speed regulation, torque control, vector control, start-up regimes, and so forth. In the embodiment illustrated in FIG. 1, various functional circuit boards 44 are linked to the control circuitry and may be provided for specific functions. For example, a wide range of options may be implemented by the use of such circuitry, including the control regimes mentioned above, as well as various communications options, safety options, and so forth.

The controller will typically allow for connection to an operator interface, which may be local at the controller and/or remote from it. In a presently contemplated embodiment, for example, an operator interface 46 may be physically positioned on the controller but removable for hand-held interfacing. The interface circuitry (e.g., portable computers) may also be coupled permanently or occasionally to the controller, such as via Internet cabling, or other network protocols, including standard industrial control protocols. Finally, the controller may be coupled to various remote monitoring and control circuitry as indicated by reference numeral 48. Such circuitry may include monitoring stations, control stations, control rooms, remote programming stations, and so forth. It should be noted that such circuitry may also include other drives, such that the operation of the system 10 may be coordinated, where desired, with that of other equipment. Such coordination is particularly useful in automation settings where a large number of operations are performed in a coordinated manner. Thus, the control circuitry 42 may form its control in coordination with logic implemented by automation controllers, separate computers, and so forth.

Figure 2:
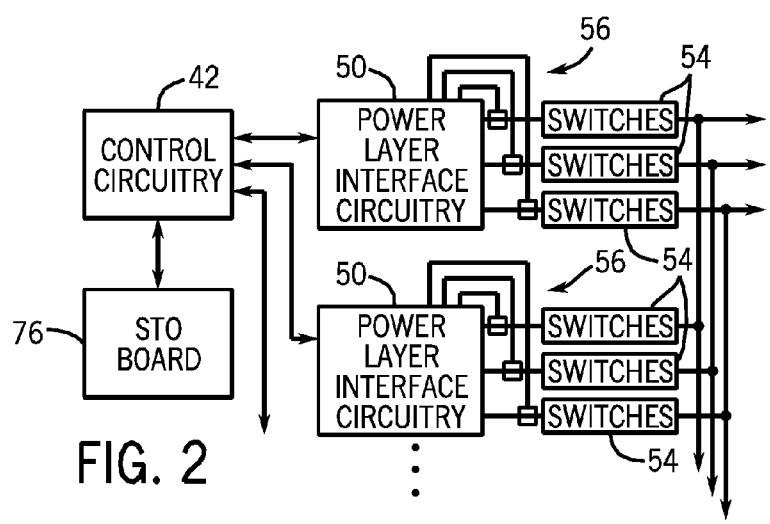
FIG. 2 is further diagrammatical representation of a portion of the system of FIG. 1 illustrating power layer interface circuitry used in the multiple parallel motor drives, in accordance with aspects of the present techniques.

FIG. 2 illustrates certain of the components that may be included within the individual drives described above. For example, the control circuitry 42 is illustrated as being coupled to power layer interface circuitry 50. Such circuitry will be provided in each drive and will operate independently within the drive, but in a coordinated manner under the control of the control circuitry. The power layer interface circuitry may include a range of circuits, such as a dedicated processor, memory, and so forth. In a presently contemplated embodiment, the power layer interface circuitry 50 includes an FPGA that implements programming for carrying out control of the power electronic switches within the individual drive. The power layer interface circuitry thus communicates with the power layer as indicated by reference numeral 52, which is itself comprised of sets of power electronic devices, such as IGBTs and diodes. These switches are illustrated generally by reference numeral 54. In a typical arrangement, the switches may be provided on a single support or on multiple supports. For example, in a presently contemplated embodiment separate supports are provided for each phase of power, with multiple IGBTs and diodes being provided on each support. These devices themselves may be constructed in any suitable manner, such as direct bond copper stacks, lead frame packages, and so forth. In general, one or several types of feedback will be provided in the circuitry as indicated by reference numeral 56. Such feedback may include, for example, output voltages, output currents, temperatures, and so forth. Other feedback signals may be provided throughout the system, such as to allow the control circuitry to monitor the electrical parameters of the incoming power, the outgoing power, the DC bus power, and so forth. In addition to monitoring electrical parameters, present techniques may also provide power supply failure protection from conditions such as overvoltage due to source or component failures. In some embodiments, the control circuitry 42 may also be coupled to a safe torque off (STO) option board 76 configured to control safety functions related to the powering of the switches 54.

The structure and operation of the control circuitry may be substantially similar to those described in U.S. published patent application no. 20100123422, entitled "Motor Controller with Deterministic Synchronous Interrupt having Multiple Serial Interface Backplane," filed by Campbell et al. on Nov. 17, 2008, which is hereby incorporated into the present disclosure by reference.

Figure 3:
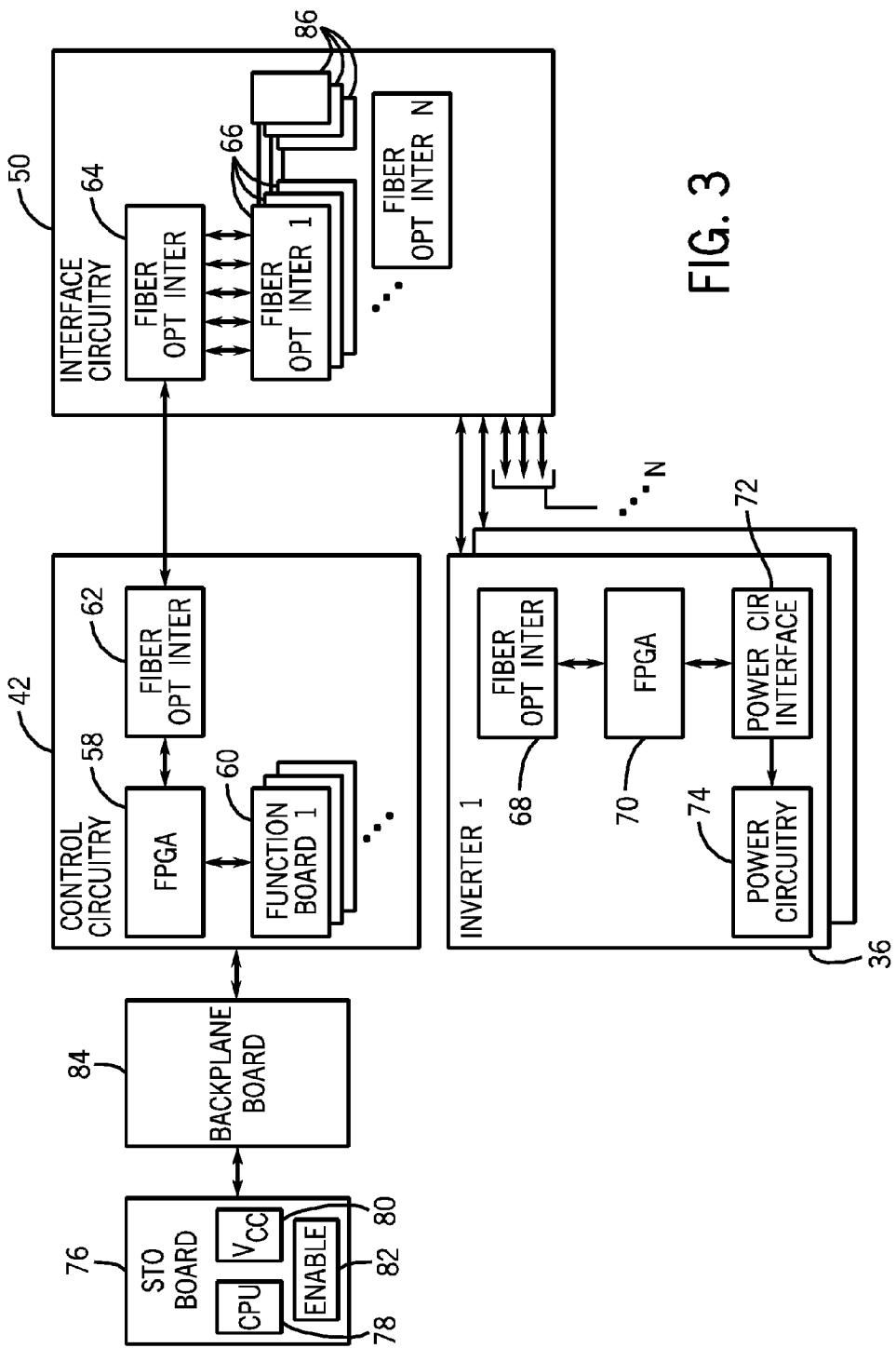
FIG. 3 is a diagrammatical representation of certain functional circuits and data exchange devices for communicating between control circuitry and power circuitry, in accordance with aspects of the present techniques.

FIG. 3 illustrates an exemplary manner in which certain functional components of the individual drives may be coupled to provide coordinated operation of the drives within the system. As shown in FIG. 3, the control circuitry 42 is coupled to the inverter circuitry 36 by the intermediary of optical interfaces. As indicated above, the control circuitry will include any suitable processing circuitry, such as an FPGA 58 in the embodiment illustrated in FIG. 3. This FPGA may include its own memory or separate memory may be provided (not shown). As also mentioned above, the FPGA 58 may perform various functions in cooperation with various function boards as indicated by reference numeral 60.

The FPGA 58 is connected to an option board 76, labeled in FIGS. 2 and 3 as the safe torque off (STO) board 76, which may disable one or more of the drives based on certain detected diagnostic errors. The board 76 includes a processor 78 which can disable a device based on the logic levels of a power supply signal and an enable signal input to the power supply circuitry 80 and the enable circuitry 82, respectively. The board 76 may be interfaced with the control circuitry 42 by a backplane board 84. In some embodiments, the back plane board 42 may include dedicated lines between the control circuitry 42 and the board 76, including lines for the power supply signal and the enable signal. As will be discussed, the power supply and enable signals may be generated for shutdown diagnostic tests conducted for each of the parallel motor drives which determine the shut-down capabilities of the drives. Furthermore, in some embodiments, other circuitry may be used to conduct various diagnostic tests. Such circuitry may also be interfaced with the control circuitry 42 by the backplane board 84. For example, the backplane board 84 may have dedicated lines between the control circuitry 42 and a speed monitor board which may use pulse tests to monitor and/or control a switching speed of the switches 54. Such additional circuitry may be used in addition to or in place of the shutdown diagnostic circuitry found in the STO board 76.

The FPGA 58 communicates with the various inverters by a fiber optic interface 62 which communicates with a mating fiber optic interface 64. This interface distributes signals to series of fiber optics interfaces 66 for the individual drives. These components, in turn, communicate with a fiber optic interface 68 at the power level of each inverter. For example, the fiber optics interfaces 66 in the interface circuitry 50 may be coupled to transceivers 86 which receive and/or transmit signals from the fiber optics interfaces 66 to the fiber optic interface 68 of each inverter. While the present disclosure provides fiber optics technology as an example for communication between the control circuitry 42 and each of the parallel inverters 36, other types of communication paths may be used. For example, suitable interfaces could be used for connecting the control circuitry 42 and the inverter 36 via a synchronous bus.

The circuitry at the power level will typically include a further FPGA 70 which may be provided on a common support (e.g., circuit board) with a power circuit interface 72. The support, which may be the present context termed the power layer interface, serves to receive signals from the control circuitry, to report signals back to the control circuitry, to generate drive signals for the power electronic switches, and so forth. The circuitry may also perform certain tests functions, such as to verify the one or more drives can be disabled when desired. The power circuit interface 72 may convert control signals to drive signals for driving the power circuitry as indicated generally by reference numeral 74. The power circuitry 74 will include the power electronic switches as described above.

The implementation of FPGAs in both the control circuitry 42 and at the power level of the inverters 36 is generally referred to as a dual FPGA configuration. The dual FPGA configuration may provide diagnostic redundancy between the control circuitry 42 and the power layer interface circuitry 50. For example, in some embodiments, the control circuitry and power level FPGA 58 and 70 includes circuitry and state machines for performing tests to determine the shut-down capabilities of each motor drive connected at the series of fiber optics interfaces 66. The FPGA logic on both sides of the interface circuitry 50 includes processors capable of processing the power supply signal and the enable signal in a shutdown diagnostic test controlled by the control circuitry 42. The shutdown diagnostic test may refer to one or more tests controlled by the control circuitry 42 to test the ability of an inverter 36 to shut down safely. For example, a shutdown diagnostic test may include an enable test which is conducted by the control circuitry and/or the power level circuitry as described below.

Figure 4:
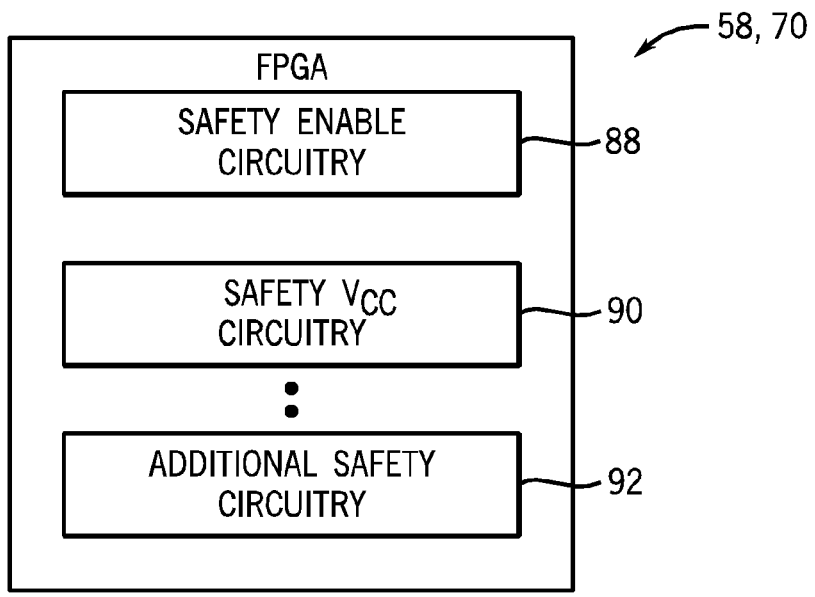
FIG. 4 is a further diagrammatical representation of a field-programmable gate array in the control circuitry and the motor drives as provided in FIG. 3, in accordance with aspects of the present techniques.

For example, as illustrated in FIG. 4, the control circuitry FPGA 58 and the FPGA 70 of each of the parallel inverters 36 may each include enable circuitry 88 and Vcc circuitry 92, which may each be used to test various components of a motor drive as part of the shutdown diagnostic test. In one embodiment, the enable circuitry 88 is configured to provide an enable signal (e.g., +24 VDC) which drives the switching of the IGBT gates of an inverter drive 36. The enable circuitry 88 may conduct a pulse test to test the ability of the inverter drive 36 to shut down in response to a pulsed voltage signal applied at the IGBT gates.

Similarly, the Vcc circuitry 90 is configured to provide a Vcc signal (e.g., +24 VDC) which powers a DC to DC converter in the inverter drive 36. The Vcc circuitry 90 may conduct a pulse test to test the ability of the inverter drive 36 to shut down in response to a pulsed voltage signal applied at the DC to DC converter. Failing the pulse tests of either the enable circuitry 88 or the Vcc circuitry 90 may indicate that the ability of the inverter drive 36 to shut down does not meet certain standards, and the enable signal and/or the Vcc signal may be discontinued from a failing inverter drive 36, such that the inverter drive 36 and/or the IGBTs may be inhibited. In certain embodiments, it may be desired that all parallel-connected drives be shut down in the event of any such drive failing either of the tests (or other tests).

In some embodiments, the enable test and the Vcc test conducted via the enable circuitry 88 and Vcc circuitry, respectively, may provide redundancy in testing to increase the integrity of the motor drive system. Furthermore, the FPGA 58 and 70 of the motor drive system may also include additional circuitry 92 which may be capable of conducting additional tests to determine the ability of the inverter drives 36 to shut down.

The structure and operation of the shutdown circuitry may be substantially similar to those described in 20100088047, entitled "Power Converter Disable Verification System and Method," filed by Campbell, et al. on Oct. 6, 2008, which is hereby incorporated into the present disclosure by reference. That reference discloses a circuit capable of quickly performing a shutdown test and "latching" the results of the test without perturbing the output signals from an inverter used to drive a motor.

Figure 5:
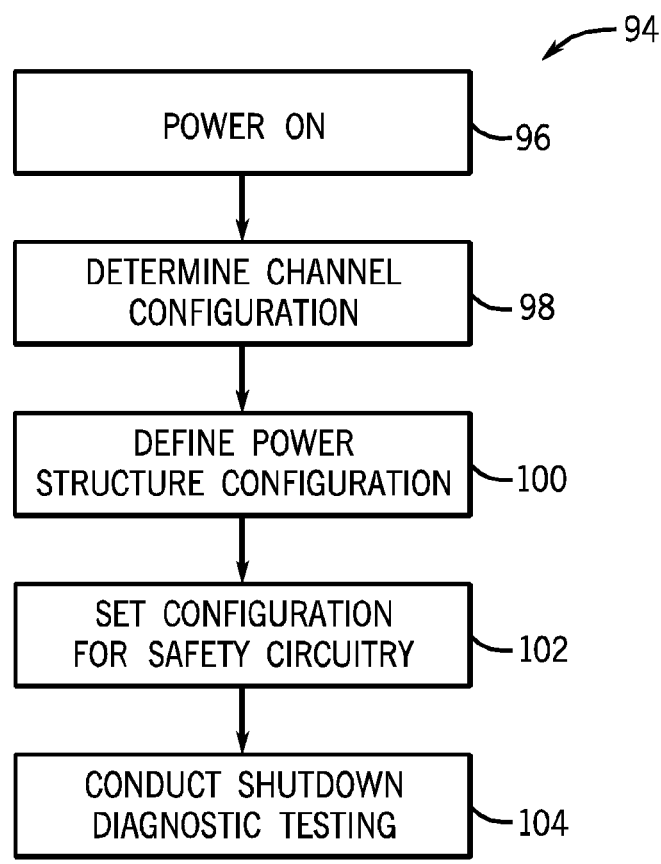
FIG. 5 is a flow chart of a process for determining channel configuration of the multiple parallel motor drives, in accordance with aspects of the present techniques.
Figure 6:
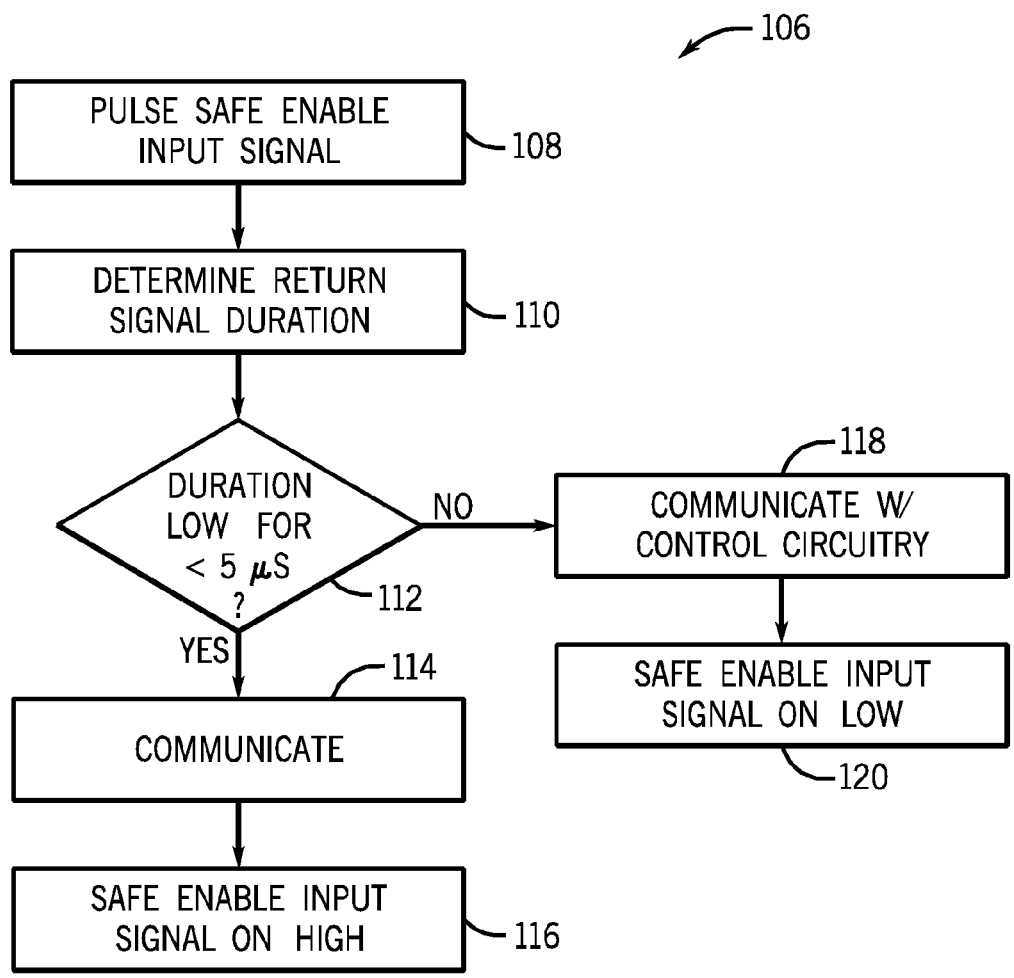
FIG. 6 is a flow chart of a process for conducting a shutdown enable test for each of the active parallel motor drives, in accordance with aspects of the present techniques.
Figure 7:
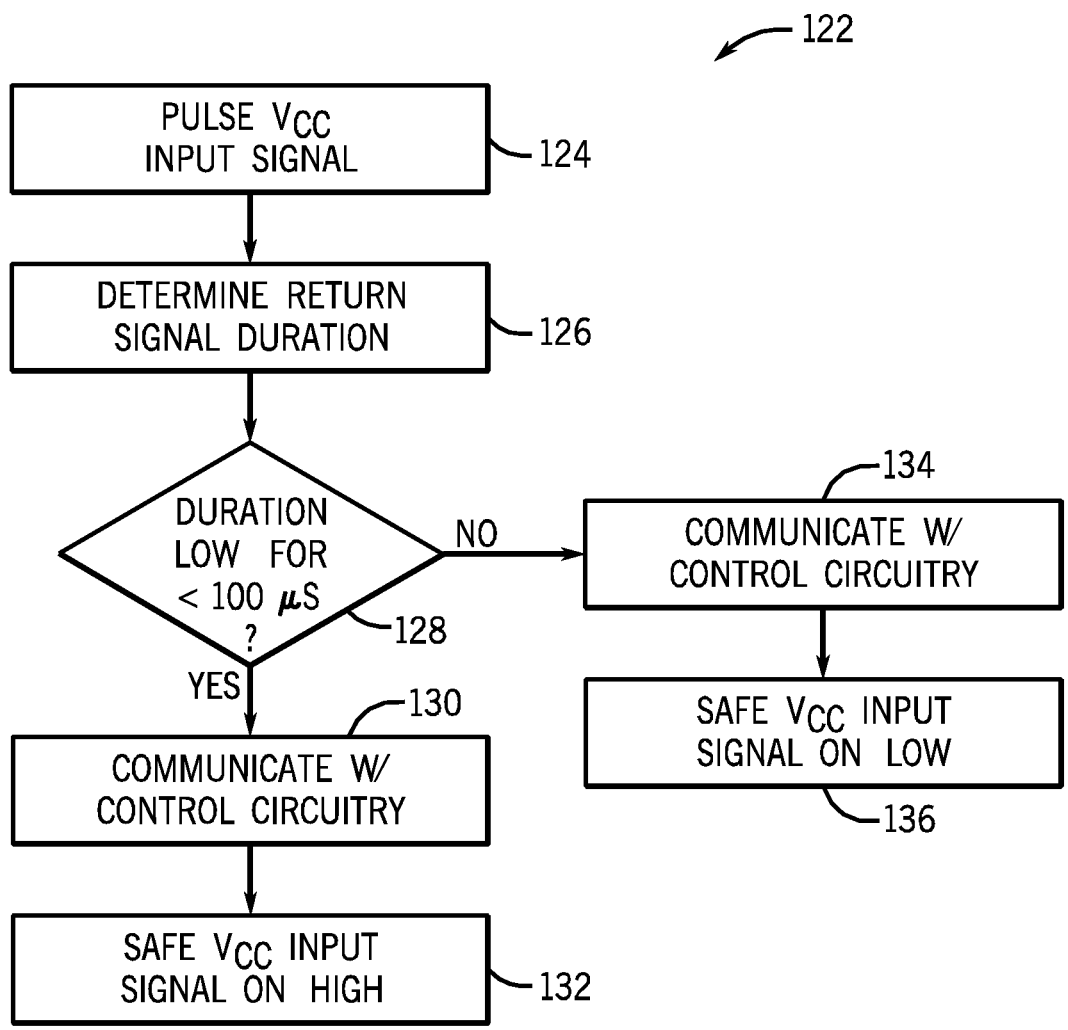
FIG. 7 is a flow chart of a process for conducting a power supply test for each of the active parallel motor drives, in accordance with aspects of the present techniques.

As larger motors and/or larger loads typically use parallel motor drives, in accordance with the present techniques, shutdown diagnostic testing may also be performed in parallel. FIGS. 5-7 are flow charts which depict processes involved in parallel shutdown diagnostic testing for a multi-drive network. Specifically, FIG. 5 depicts a process 94 for determining the power block configuration in systems with multiple power blocks configured in parallel, FIG. 6 depicts a process 106 for conducting an enable test once the power block configuration is determined, and FIG. 7 depicts a process 122 for conducting a Vcc test once the power block configuration is determined.

Beginning first with FIG. 5, the process 94 begins by supplying (block 96) power to the different control components of the power drive system, including the control circuitry 42, the interface circuitry 50, and the inverter circuitry 36. When the components are powered, the fiber optics transceivers 86 are read to determine (block 98) which of the power blocks (e.g., which of N number of inverters 36) are configured or in operation. Unused channels, or power blocks not in communication with the interface circuitry 50, may be decoupled from its respective transceiver 86. Once the configured channels are determined, the power structure configuration may be defined (block 100). The power structure configuration may be set (block 102) internally to the FPGA logic 58 and 70 and may be accessible by the control circuitry 42, thus establishing the shutdown test configuration during shutdown diagnostic testing. Though multiple channels may be available, and not all channels may be utilized at one instant, the power block configuration determination process 94 may allow shutdown diagnostic testing (e.g., pulsed enable test or pulsed Vcc test) to be conducted (block 104) for only active channels. Thus, inactive channels will not return error signals, as the shutdown test configuration does not include inactive channels and sets only the active channels to the logic in the FPGA 58 and 70.

In one or more embodiments, shutdown diagnostic testing includes an enable test 106 provided in the flow chart of FIG. 6 and a Vcc test 122 provided in the flow chart of FIG. 7. Each of the enable test 106 and the Vcc test 122 are suitable for multi-channel power drive configurations and can be performed when the power block configuration is determined (as in FIG. 5). The enable test 106 may start by pulsing (block 108) the enable input signal from a logical one (which may provide +25 VDC to the IGBT gates of the tested inverter 36). The response to the enable input signal pulse, referred to as the enable return signal, may be detected (block 110), and the duration of a change in logical states of the return signal may be measured. Processors or circuitry in the inverter FPGA 70 may determine (block 112) whether the duration of the change in logical states of the return signal is less than 5 μs. A duration of the change in logical states of the return signal as less than 5 μs indicates a successful response in the enable test 106. The inverter FPGA 70 may communicate (block 114) the response through the fiber optics interface circuitry 50 with the control circuitry 42. The control circuitry FPGA 58 may then communicate with the STO board 76 which may assert (block 116) the safe enable input signal high to a logical one.

If the duration of the change in logical states of the return signal is not less than 5 μs, the process 106 may determine that the enable test 106 did not return a successful result for the inverter 36 tested. The inverter FPGA 70 may communicate (block 118) through the fiber optics interface circuitry 50 with the control circuitry 42. The control circuitry FBGA 58 may then communicate with the option board 76 which may assert (block 120) the enable input signal from the enable circuitry 82 low to a logical zero. In embodiments, the enable test 106 may be performed repeatedly at certain increments (e.g., every 100 ms, every 250 ms, etc.). In some embodiments, the control circuitry 42 may control and/or initiate the enable test 106 based on, for example, configuration changes in the parallel operating inverter drives 36.

Turning now to FIG. 7, the Vcc test 122 may begin by pulsing (block 124) the Vcc test input signal from a logical one (which may provide +25 VDC to the DC to DC bridge of the tested inverter 36). In some embodiments, the Vcc test input signal may be generated to follow the enable test 106. For example, the Vcc test 122 may be initiated approximately 100 μs after the initiation of the enable test 106. In other embodiments, the enable test 106 and the Vcc test 122 can be implemented substantially simultaneously, or different lag times between the enable test 106 and the Vcc test 122 can be implemented, depending on the function of the system 10. The response to the Vcc test input signal pulse, referred to as the Vcc test return signal, may be detected (block 126), and the duration of a change in logical states of the Vcc test return signal may be measured. Processors or circuitry in the inverter FPGA 70 may determine (block 128) whether the duration of the change in logical states of the Vcc test return signal is less than 100 μs. A duration of the change in logical states of the Vcc test return signal as less than 100 μs indicates a successful response in the Vcc test 122. The inverter FPGA 70 may communicate (block 130) the response through the fiber optics interface circuitry 50 with the control circuitry 42. The control circuitry FPGA 58 may then communicate with the option board 76 which may assert (block 132) the Vcc test input signal high to a logical one.

If the duration of the change in logical states of the return signal is not less than 100 µs, the process 122 may determine that the Vcc test 122 did not return a successful result for the inverter 36 tested. The inverter FPGA 70 may communicate (block 134) through the fiber optics interface circuitry 50 with the control circuitry 42. The control circuitry FBGA 58 may then communicate with the option board 76 which may assert (block 136) the Vcc test input signal from the Vcc circuitry 80 low to a logical zero. In embodiments, the enable test 122 may be performed repeatedly at certain increments (e.g., every 100 ms, every 250 ms, etc.). In some embodiments, the control circuitry 42 may control and/or initiate the Vcc test 122 based on, for example, configuration changes in the parallel operating inverter drives 36.

It should be noted that the foregoing verification tests may be run in parallel or sequentially, and are particularly designed to be run on multiple parallel inverter circuits, with coordinated reporting of the results of the tests. Moreover, the tests may be run during operation of the parallel drives without perturbing their normal drive functionality. That is, in a presently contemplated embodiment, when an option board is present for initiating the test, such tests may be run every 250 ms. When an option board is not present, the common control circuitry itself may launch such tests, such as, in the same embodiment, every 400 ms. Once initiated, the control circuitry prompts the power layer circuitry to actually perform the desired tests and then to report back the results to the control circuitry.

The coordination of reporting may be accomplished in a number of ways, including by setting and changing logical flags as discussed above. In a presently contemplated embodiment, the option board (if present) or common control circuitry may execute code that effectively combines the received test results. For example, the circuitry may execute an algorithm that may be expressed:

```
If (((xiv_FO-LoginActFlag(0) and sb_Ch1_EnHealthSts) or
      (xiv_FO-LoginActFlag(1) and sb_Ch2_EnHealthSts) or
      (xiv_FO-LoginActFlag(2) and sb_Ch3_EnHealthSts) or
      (xiv_FO-LoginActFlag(3) and sb_Ch4_EnHealthSts) or
      (xiv_FO-LoginActFlag(4) and sb_Ch5_EnHealthSts)) = '0'
  then
      sb_EnHealthAccum <= '0';
end if;
if (xiv_FO_LogInActFlag /= "00000") then
    if ((((not xiv_FO_LogInActFlag(0)) or sb_Ch1_EnHealthSts) and
        ((not xiv_FO_LogInActFlag(1)) or sb_Ch2_EnHealthSts) and
        ((not xiv_FO_LogInActFlag(2)) or sb_Ch3_EnHealthSts) and
        ((not xiv_FO_LogInActFlag(3)) or sb_Ch4_EnHealthSts) and
        ((not xiv_FO_LogInActFlag(4)) or sb_Ch5_EnHealthSts)) =
        '1') then
        sb_EnHealthAccum <= '1';
end if.
```

The logic summarized is indicated as relating to the enable test, although similar logic may be used for the Vcc test (or other tests performed). As will be appreciated by those skilled in the art, this algorithm effectively checks to determine whether multiple drives are "logged in" to the system, and then logically combines results into an overall or composite result. That is, when each drive is started, the drive "logs in" to the control circuitry. The log-in check allow the same logic to be used for multiple drives without returning a false failure in the event that one or more drives is not present (the logic here allows for the control circuitry to use the same test result combination logic for up to 5 drives. A result bit is then set to a default value, and the logic requires that all tests for all drives (that have logged in) be passed before the result bit will be changed to a "pass". Such logic may be implemented by analog or digital components.

It is also be noted that, although the results of the combination may be a single value, the control circuitry (and/or the option board) will typically receive and store information that served as the basis for the combined result. Thus, the system would have, store, and can report which drive failed, the particular test failed, the time of the failure, and so forth.

Furthermore, while the present disclosure discusses mechanisms such as the enable test 106 and the Vcc test 122 for shutdown diagnostic testing, the present techniques include various other mechanisms involving a dual FPGA configuration. As discussed, various modifications may be made to the enable test 106 and/or the Vcc test 122. Moreover, other types of tests which use the parallel communication techniques between the FPGA 58 of the control circuitry 42 and the FPGA 70 of the inverter 36 may be suitable for conducting shutdown diagnostic testing.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An electric motor drive system comprising:
    a plurality of drive modules each comprising a converter for converting incoming AC power to DC power and an inverter coupled to the converter for converting the DC power to controlled frequency AC power;
    a common controller coupled to all of the inverters and configured to provide signals to the inverters to permit each inverter to generate gate drive signals for power electronic switches of the respective inverter separately and in parallel with one another; and
    shutdown circuitry configured to conduct a shutdown diagnostic test on the plurality of drive modules, wherein the shutdown diagnostic test verifies the ability of the shutdown circuitry to disable to plurality of drive modules;
    wherein the common controller is configured to command the shutdown circuitry to run the shutdown diagnostic test during normal operation of the plurality of drive modules in driving an electric motor.

2. The electric motor drive of claim 1, wherein the shutdown circuitry comprises power layer circuitry in each of the plurality of drive modules, the power layer circuitry of each of the plurality of drive modules being coupled to the common controller via respective optical fiber connections.

3. The electric motor drive of claim 1, wherein the shutdown circuitry is configured to conduct an enable test on each of the plurality of drive modules in parallel, wherein the enable test comprises:
    pulsing an enable input signal to transistor gates of the respective one of the plurality of drive modules;
    measuring an enable return signal from the transistor gates of the respective one of the plurality of drive modules; and
    determining an enable return signal duration for which the enable return signal is at a logic low.

4. The electric motor drive of claim 3, wherein the shutdown circuitry is configured to disable the enable input signal to the transistor gates of the respective one of the plurality of drive modules if the enable return signal duration is greater than time in which the transistor gates switch states.

5. The electric motor drive of claim 3, wherein the shutdown circuitry is configured to disable the enable input signal to the transistor gates of the respective one of the plurality of drive modules if the return signal duration is greater than approximately 5 µs.

6. The electric motor drive of claim 3, wherein the shutdown circuitry is configured to conduct a power supply test on each of the plurality of drive modules in parallel, wherein the power supply test comprises:
pulsing a power supply input signal to a DC to DC converter in the respective one of the plurality of drive modules;
measuring a power supply return signal from the DC to DC converter of the respective one of the plurality of drive modules; and
determining a power supply return signal duration for which the enable return signal is at a logic low.

7. The electric motor drive of claim 6, wherein the shutdown circuitry is configured to disable the power supply input signal to the DC to DC converter of the respective one of the plurality of drive modules if the power supply return signal is greater than a threshold.

8. The electric motor drive of claim 7, wherein the threshold is approximately 100 µs.

9. The electric motor drive of claim 1, wherein the common controller is configured:
determine an active configuration based on which of the plurality of drive modules is active; and
communicate the active configuration to the shutdown circuitry, wherein the shutdown circuitry is configured to perform the shutdown diagnostic test based on the active configuration.

10. The electric motor drive of claim 1, wherein the common controller is configured to combine feedback from the plurality of drive modules based upon results of the shutdown diagnostic test.

11. The electric motor drive of claim 10, wherein the common controller is configured to shut down at least one of the plurality of drive modules if the at least one of the plurality of drive modules does not return a pass signal as a result of the shutdown diagnostic test.

12. The electric motor drive of claim 11, wherein the common controller is configured to shut down all of the plurality of drive modules if at least one of the plurality of drive modules does not return a pass signal as a result of the shutdown diagnostic test.

13. The electric motor drive of claim 1, wherein the common controller is configured to store data representative of results of the shutdown diagnostic test run by each of the plurality of drive modules.

14. The electric motor drive of claim 1, wherein the common controller is configured to command the shutdown circuitry to run the shutdown diagnostic test periodically during normal operation of the plurality of drive modules in driving an electric motor.

15. The electric motor drive of claim 1, comprising a parallel bus, wherein the plurality of drive modules each comprise a drive interface and the common controller comprises a controller interface, and wherein the parallel bus is configured to connect the controller interface with the drive interface of each of the plurality of drive modules.

16. A method of performing a shutdown diagnostic test in a motor drive, the method comprising:
determining a channel configuration of a plurality of motor drives in the motor drive system, wherein the channel configuration comprises active motor drives in the plurality of motor drives;
communicating the channel configuration to shutdown circuitry;
transmitting a pulsed input signal from the shutdown circuitry in parallel to each of the active motor drives in the channel configuration;
measuring a return signal in parallel from each of the active motor drives;
determining whether the return signal from each of the active motor drives has a logic low period within a threshold; and
deactivating a signal to one of the active motor drives if the return signal does not have a logic low period within the threshold.

17. The method of claim 16, wherein the pulsed input signal comprises a pulsed enable signal transmitted to transistor gates in each of the active motor drives.

18. The method of claim 17, wherein the threshold is based on a switching frequency of the transistor gates.

19. The method of claim 17, wherein the threshold is approximately 5 µs.

20. The method of claim 16, wherein the pulsed input signal comprises a pulsed power supply signal transmitted to a DC to DC converter in each of the active motor drives.

21. The method of claim 20, wherein the threshold is approximately 100 µs.

22. A method of operating a motor drive, the method comprising:
driving a motor by combined multi-phase output signals from a plurality of parallel inverters;
from common control circuitry coupled to all of the plurality of parallel inverters, transmitting shutdown test signals a shutdown circuitry in a power layer of each of the plurality of inverters in parallel;
receiving in the common control circuitry response data indicative of a result in each power layer of each of the plurality of inverters; and
combining the response data into a single test result value.

23. The method of claim 22, comprising shutting down at least one of the plurality of parallel inverters if the at least one of the plurality of parallel inverters does not return a pass signal as a result of the shutdown diagnostic test.

24. The method of claim 23, comprising shutting down all of the plurality of parallel inverters if at least one of the plurality of parallel inverters does not return a pass signal as a result of the shutdown diagnostic test.

25. The method of claim 22, comprising storing data representative of results of the shutdown diagnostic test run by each of the plurality of parallel inverters.

26. The method of claim 22, comprising running the shutdown diagnostic test periodically during normal operation of the plurality of parallel inverters in driving the electric motor.

* * * * *